(12) United States Patent
Dentoni Litta et al.

(10) Patent No.: US 11,488,954 B2
(45) Date of Patent: Nov. 1, 2022

(54) METHOD OF COINTEGRATING SEMICONDUCTOR STRUCTURES FOR DIFFERENT VOLTAGE TRANSISTORS

(71) Applicant: IMEC vzw, Leuven (BE)

(72) Inventors: Eugenio Dentoni Litta, Leuven (BE); Alessio Spessot, Heverlee (BE)

(73) Assignee: IMEC vzw, Leuven (BE)

( * ) Notice: Subject to any disclaimer, the term of this patent is extended or adjusted under 35 U.S.C. 154(b) by 47 days.

(21) Appl. No.: 17/127,424

(22) Filed: Dec. 18, 2020

(65) Prior Publication Data

US 2021/0202480 A1 Jul. 1, 2021

(30) Foreign Application Priority Data

Dec. 19, 2019 (EP) .................................. 19218175

(51) Int. Cl.
*H01L 27/088* (2006.01)
*H01L 21/8234* (2006.01)
(Continued)

(52) U.S. Cl.
CPC .. *H01L 27/0886* (2013.01); *H01L 21/823431* (2013.01); *H01L 21/823481* (2013.01); *H01L 27/11286* (2013.01)

(58) Field of Classification Search
CPC ..... H01L 21/823431; H01L 21/823821; H01L 21/845; H01L 29/66795–66818;
(Continued)

(56) References Cited

U.S. PATENT DOCUMENTS 9,972,621 B1  5/2018  Wu et al.
2008/0230852 A1*  9/2008  Yu .......................... H01L 29/785
257/E27.06
(Continued)

OTHER PUBLICATIONS

Baudot, C., "Addressing future trends in integrated silicon photonics", Silicon Technology Development—Process Integration, STMicroelectronics (Crolles 2) SAS—France in 29 pages (Unknown Date: Downloaded on Mar. 9, 2021 from https://www.google.com/url?sa=t&rct=j&q=&esrc=s&source=web&cd=&ved=2ahUKEwi5o73x36PvAhXHLs0KHYsSCJYQFjADegQIDhAD&url=https%3A%2F%2Fphoxtrot.eu%2Fwp-content%2Fuploads%2F2017%2F01%2FECOC-2016-Charles-Baudot.pdf&usg=AOvVaw0c0huHtvVX6Q-FHa14dGW8).
(Continued)

*Primary Examiner* — Sonya McCall-Shepard
(74) *Attorney, Agent, or Firm* — Knobbe, Martens, Olson & Bear, LLP

(57) ABSTRACT

The disclosed technology relates generally to semiconductor devices and manufacturing methods thereof, and more particularly to field-effect transistors operating at different voltages and methods for integrating the same. In one aspect, a method of fabricating a semiconductor device comprises: a) providing a substrate and a first hardmask; b) next, providing a second hardmask over a first region of the first hardmask; c) next, forming a first set of hardmask fins in a second region of the first hardmask; d) next, masking the second region; e) next, providing a set of photoresist fins on the second hardmask; f) next, patterning the second hardmask and the first region by using the photoresist fins as a mask; g) next, forming a first set of semiconductor fins of a first height by etching the substrate; h) next, removing the mask provided in step d; i) next, forming a second set of semiconductor fins of a second height in the second region and extending the height of the first set of semiconductor fins (Continued)

to a third height in the first region, by etching the substrate by using the first and second sets of hardmask fins as masks.

14 Claims, 12 Drawing Sheets

(51) Int. Cl.
*H01L 27/112* (2006.01)
*H01L 27/11546* (2017.01)
*H01L 21/467* (2006.01)

(58) Field of Classification Search
CPC ..... H01L 29/41791; H01L 29/785–786; H01L 2029/7857–7858; H01L 27/0886; H01L 27/0924; H01L 27/10826; H01L 27/10879; H01L 27/1211; H01L 21/308–3088; H01L 21/027–0274; H01L 21/033–0338; H01L 21/3213; H01L 21/32139; H01L 21/465–47573; H01L 27/0922
See application file for complete search history.

(56) References Cited

U.S. PATENT DOCUMENTS

| | | |
|---|---|---|
| 2013/0072023 A1 | 3/2013 | Zhu et al. |
| 2014/0008733 A1 | 1/2014 | Shrivastava et al. |
| 2015/0263173 A1 | 9/2015 | Lue |
| 2017/0243955 A1 | 8/2017 | Shinohara |
| 2018/0122930 A1 | 5/2018 | Okamoto et al. |
| 2018/0151414 A1 | 5/2018 | Wu et al. |
| 2019/0189457 A1 | 6/2019 | Lie et al. |

OTHER PUBLICATIONS

Spessot et al., "Cost effective FinFET platform for Stand Alone DRAM 1Y and beyond memory periphery", ©2018 IEEE in 4 pages.
Extended European Search Report dated Jun. 2, 2020 in counterpart European Application No. 19218175.8 in 10 pages.

* cited by examiner

METHOD OF COINTEGRATING SEMICONDUCTOR STRUCTURES FOR DIFFERENT VOLTAGE TRANSISTORS

CROSS-REFERENCE TO RELATED APPLICATIONS

This application claims foreign priority to European Patent Application No. 19218175.8, filed Dec. 19, 2019, the content of which is incorporated by reference herein in its entirety.

BACKGROUND

Field

The disclosed technology relates generally to semiconductor devices and manufacturing methods thereof, and more particularly to field-effect transistors operating at different voltages and methods for integrating the same.

Description of the Related Technology

Some semiconductor devices, e.g., nonvolatile memory devices, include transistors operating at different voltages. For example, low voltage (LV) transistors may be associated with conducting control signals while high voltage (HV) transistors may be associated with accessing a memory array. However, cointegrating LV and HV transistors in the same device is particularly challenging due to the very different requirements existing for the LV and HV transistors, e.g., fin field effect transistors (FinFETs).

SUMMARY OF CERTAIN INVENTIVE ASPECTS

It is an object of the disclosure to provide methods for manufacturing a semiconductor device. It is another object of the present disclosure to provide a semiconductor device obtainable by the methods.

The above objective is accomplished by methods and devices according to the disclosed technology.

In a first aspect, the disclosed technology relates to a method for manufacturing a semiconductor device 1 comprising the steps of:
  a) Providing an assembly 2 comprising a semiconductor substrate 3 and a first hardmask layer 4 thereover,
  b) Providing a second hardmask layer 5 over a first region R1 of the first hardmask layer 4,
  c) Forming a first set of hardmask fins 6 in a second region R2 of the first hardmask layer 4, not overlapping with the first region R1,
  d) masking the second region R2 with a masking material 7,
  e) Providing a set of photoresist fins 8 on the second hardmask layer 5,
  f) Patterning the second hardmask layer 5 and the first region R1 of the first hardmask layer 4 by using the photoresist fins 8 as a mask, thereby forming a second set of hardmask fins 9 in the first region R1 of the first hardmask layer 4,
  g) Forming a first set of semiconductor fins 10 of a first height h1 by etching the semiconductor substrate 3 while using the second set of hardmask fins 9 as a mask,
  h) Removing the masking material 7 provided in step d,
  i) Forming a second set of semiconductor fins 11 of a second height h2 in the second region R2 and extending the height of the first set of semiconductor fins 10 to a third height h3 in the first region R1, by etching the semiconductor substrate 3 by using the first and second sets of hardmask fins 6, 9 as masks.

In a second aspect, the disclosed technology relates to a semiconductor device 1 comprising a semiconductor substrate 3 comprising:
  a. A first region R1 comprising a first platform and a first set of semiconductor fins 10 projecting perpendicularly therefrom, the semiconductor fins 10 having coplanar top surfaces 16 and the first platform having a top surface 15,
  b. A second region R2 comprising a second platform and a second set of semiconductor fins 11 projecting perpendicularly therefrom, the semiconductor fins 11 having coplanar top surfaces 18 and the second platform having a top surface 17,
  wherein the first region R1 and the second region R2 are not overlapping,
  wherein the top surface 15 of the first platform is lower than the top surface 17 of the second platform, and
  wherein the coplanar top surfaces 16 of the first set of semiconductor fins 10 are coplanar with the coplanar top surfaces 18 of the second set of semiconductor fins 11.

It is an advantage of various embodiments of the disclosed technology that fin sets differing in height can be achieved, thereby allowing both a higher isolation material height and a higher uncovered top portion for the first set of semiconductor fins. Taller fins for the first fin set are advantageous since they reduce footprint. A high isolation material height for the first set is advantageous because these fins are typically used to form transistors operating at high voltage for which a good isolation is preferred.

It is an advantage of methods according to embodiments of the disclosed technology that they require only a single flow having a small number of steps, all compatible with standard VLSI procedures.

It is an advantage of embodiments of the disclosed technology that the first set of semiconductor fins require a single simple lithography step.

It is an advantage of embodiments of the disclosed technology that it allows separate optimization of the first set and of the second set of semiconductor fins.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the disclosed technology will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
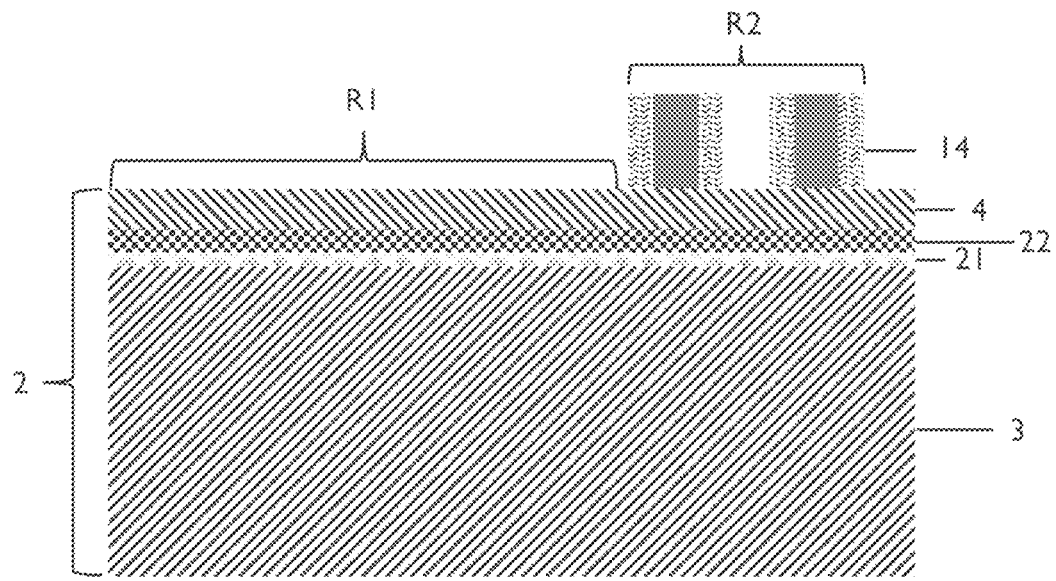
FIGS. 1-6 are schematic representations of vertical cross-sections through intermediate structures obtained at different steps according to an example method.
Figure 2:
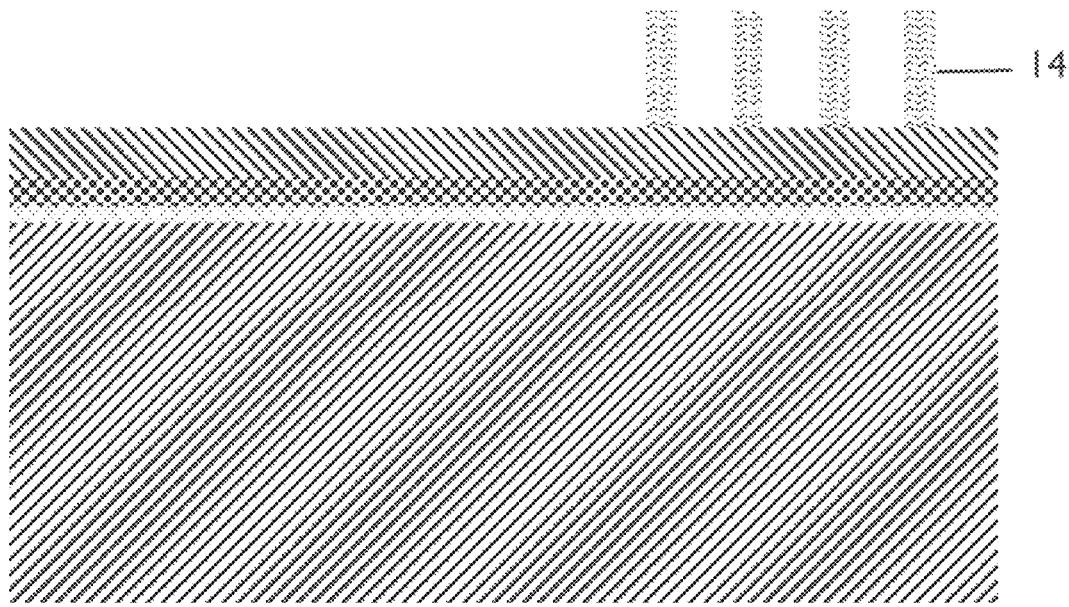
Figure 3:
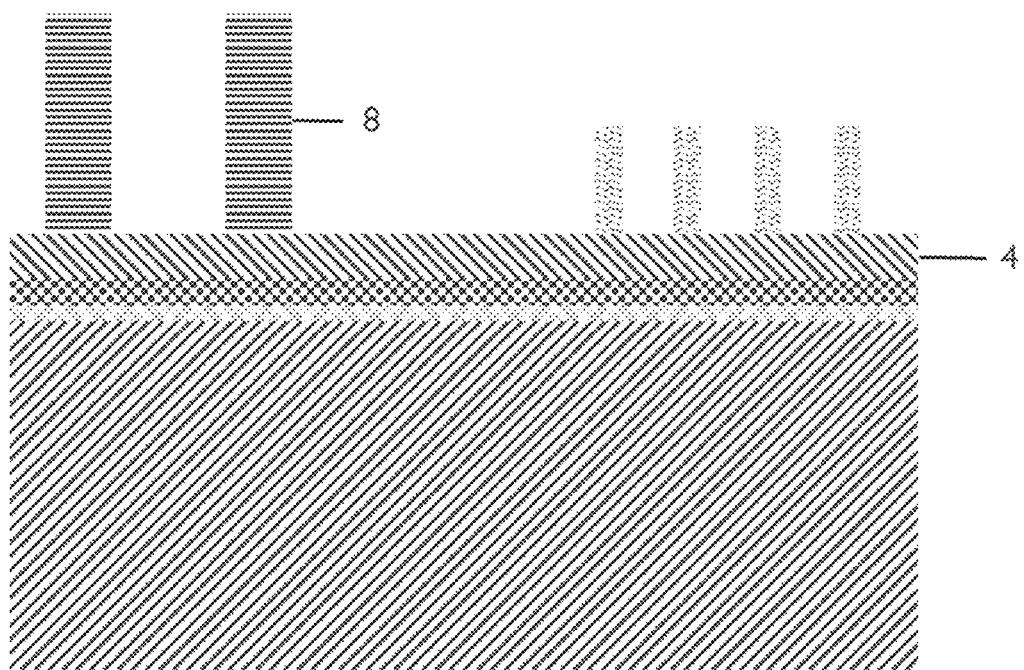
Figure 4:
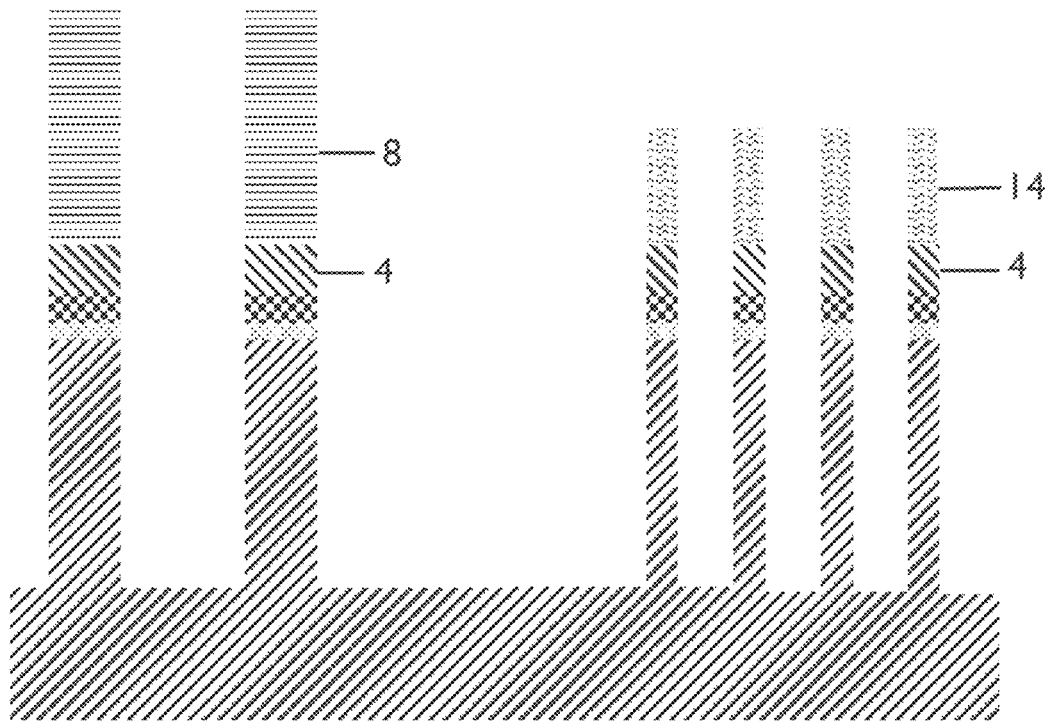
Figure 5:
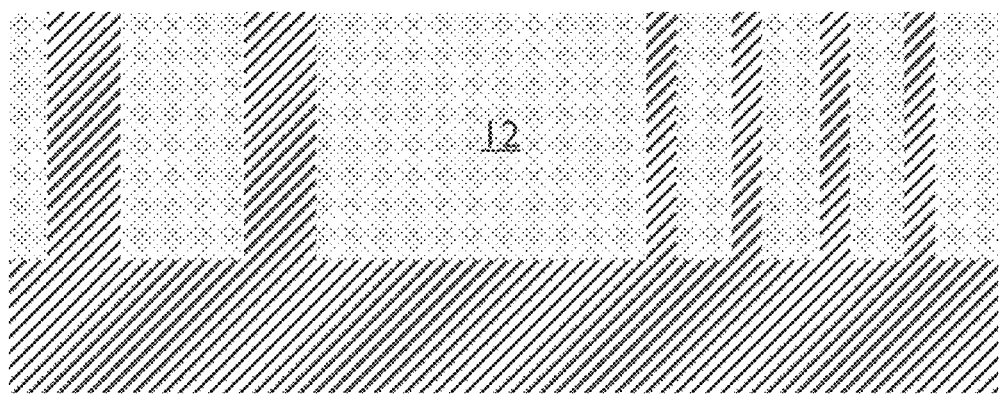
Figure 6:
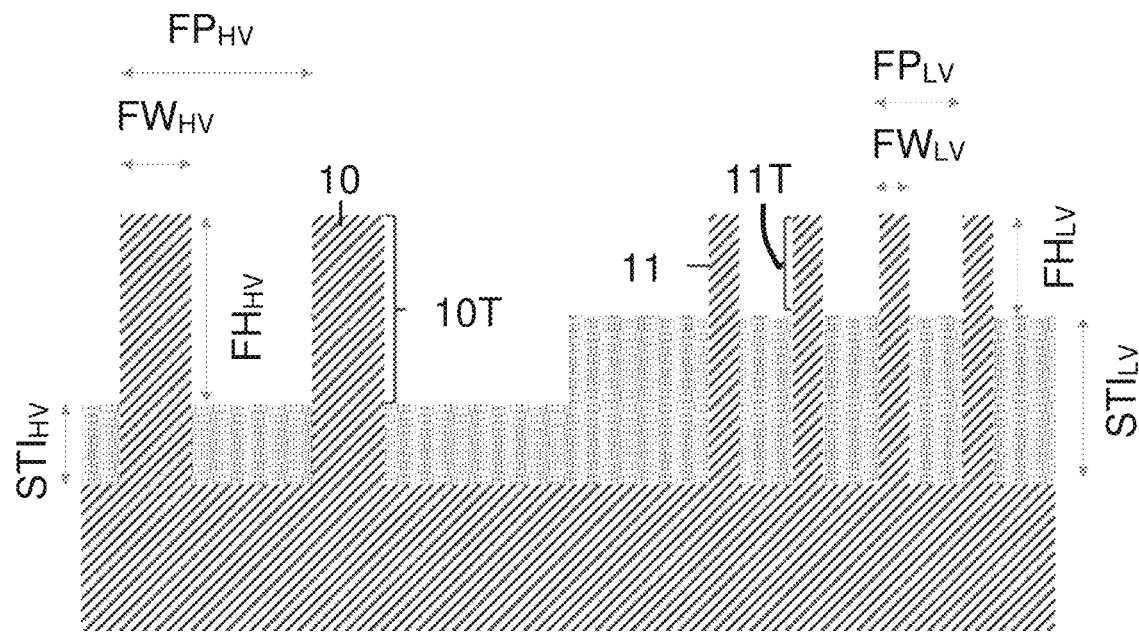

In the different figures, the same reference signs refer to the same or analogous elements.

DETAILED DESCRIPTION OF CERTAIN ILLUSTRATIVE EMBODIMENTS

The disclosed technology will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. The word "comprising" according to the invention therefore also includes as one embodiment that no further components are present. Thus, the scope of the expression "a device comprising means A and B" should not be interpreted as being limited to devices consisting only of components A and B. It means that with respect to the disclosed technology, the only relevant components of the device are A and B.

Reference throughout this specification to "one embodiment" or "an embodiment" means that a particular feature, structure or characteristic described in connection with the embodiment is included in at least one embodiment of the disclosed technology. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The following terms are provided solely to aid in the understanding of the invention.

As used herein, and unless provided otherwise, the term "NAND memory device" refers to a type of flash memory, i.e. an electronic solid-state non-volatile computer memory device that can be electrically erased and reprogrammed. NAND memory devices may be erased, written and read in blocks (or pages) which are generally much smaller than the entire device. A NAND memory device has a memory part and a peripheral circuitry. The hierarchical structure of the memory part of a NAND memory device is composed of cells arranged as strings, themselves arranged as pages, themselves arranged as blocks, themselves arranged as planes. The memory part comprises one or more planes. The peripheral circuitry is a circuitry adapted to perform read, write, and erase operations on the memory part.

Periphery transistors in some memory devices, e.g., NAND memory devices, are currently based on polycrystalline $Si/SiO_2$ planar technology where low voltage and high voltage transistors are cointegrated. The low voltage transistors typically conduct the signals while the high voltage transistors typically access the memory.

Voltage levels and the associated device structures such as gate dielectric thicknesses may not scale significantly in the next generations of these memory devices, such as three-dimensional (3D) NAND memory devices. However, a shift in transistor architecture from planar FET to FinFET is being considered because of several advantages.

For example, for LV transistors, logic-like FinFETs could improve threshold voltage mismatch and circuit performance.

For HV transistors, tall FinFETs at relaxed fin pitch could provide area scaling.

However, cointegrating LV and HV FinFETs in the same device is particularly challenging due to the very different device structures for the LV and HV FinFETs.

The disclosed technology is directed to a method of achieving such cointegration.

The invention will now be described by a detailed description of several embodiments of the invention. It is clear that other embodiments of the invention can be configured according to the knowledge of persons skilled in the art without departing from the technical teaching of the invention, the invention being limited only by the terms of the appended claims.

Reference will be made to transistors. These are devices having a first main electrode such as a drain, a second main electrode such as a source and a control electrode such as a gate for controlling the flow of electrical charges between the first and second main electrodes.

Prior to arriving at the solution embodied by the disclosed technology, the inventors have envisioned a comparative process for forming such devices as depicted in FIGS. 1-6.

Referring to FIGS. 1-6, first, an assembly 2 comprising a silicon substrate 3, a silicon oxide 21 thereon, a silicon nitride 22 on the silicon oxide 21, and a first hardmask layer 4 on the silicon nitride 22, is provided. Then, a first region R1 is left pattern-free while a pattern of fins is formed on a second region R2 of the first hardmask by self-aligned double patterning (see FIG. 1). Next, a core used in the self-aligned double patterning process is removed, leaving only spacers. These spacers form a pattern of fins 14 (see FIG. 2). Next, a set of photoresist fins 8 are provided in the first region R1 (see FIG. 3). Next, the first hardmask layer 4, the silicon nitride 22, the silicon oxide 21, and the silicon substrate are patterned using the spacers 14 and the set of photoresist fins 8 as masks (see FIG. 4). Next, a layer of isolation material 12 is deposited so as to cover the entire part of the device in construction present in the first and the second region R2, followed by chemical mechanical planarization and/or wet/dry etching until the top surface of the semiconductor fins of the first and the second set are exposed (see FIG. 5). Next, a top portion 10t of the semiconductor fins 10 of the first set and a top portion 11t of the semiconductor fins 11 of the second set are uncovered by recessing the isolation material 12 more in the first region R1 than in the second region R2 so that the uncovered top portion 11T of the fins 11 of the second set is smaller than the uncovered top portion 10T of the fins 10 of the first set (see FIG. 6).

A consequence of this flow is that the height of both types of fins is the same. A direct consequence of this is that if one wishes to provide a larger height for the isolation material in the first region than for the isolation material in the second region, the uncovered top portion of the first set of semiconductor fins will be smaller than the uncovered top portion of the second set of semiconductor fins. This can be disadvantageous since both a higher isolation material height and a higher uncovered top portion for the first set of semiconductor fins may be preferred for such devices.

We now turn to embodiments of the disclosed technology.

We now refer to FIGS. 7-13.

Figure 12:
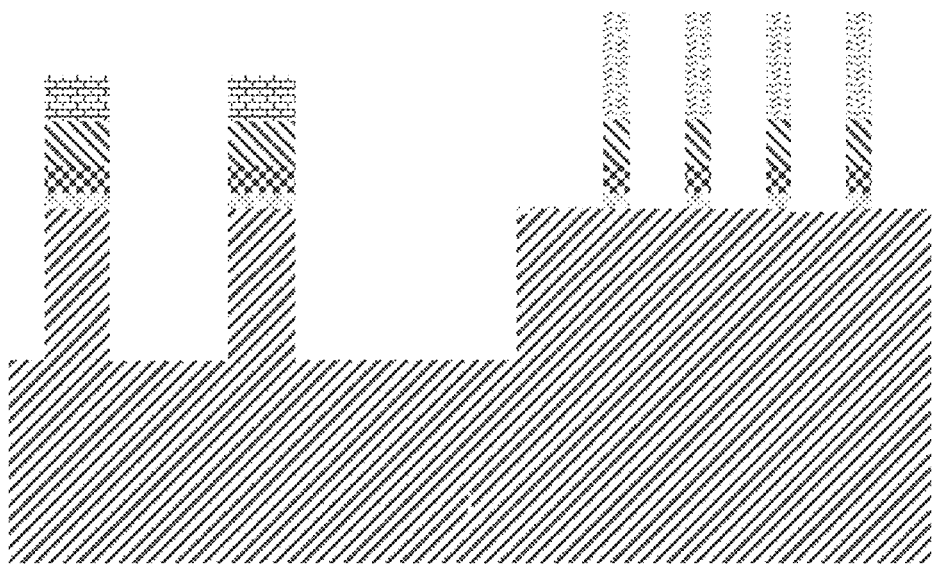
Figure 13:
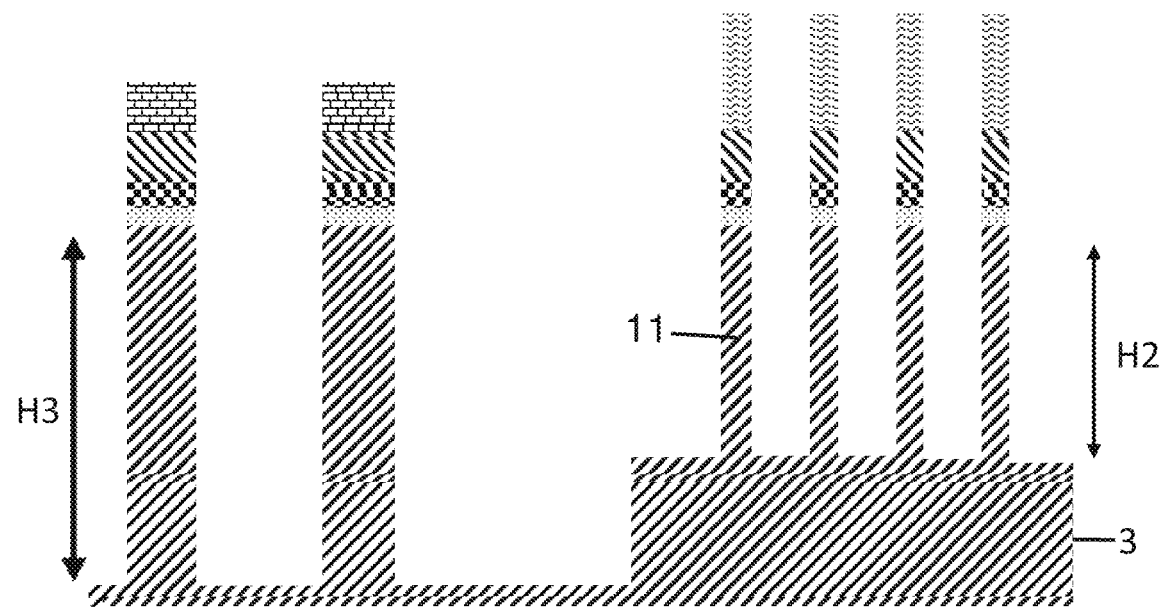

In a first aspect, the disclosed technology relates to a method of manufacturing a semiconductor device 1 comprising the steps of:

a) Providing an assembly 2 comprising a semiconductor substrate 3 and a first hardmask layer 4 thereover, b) Providing a second hardmask layer 5 over a first region R1 of the first hardmask layer 4 (exemplified in FIG. 7), c) Forming a first set of hardmask fins 6 in a second region R2 of the first hardmask layer 4, not overlapping with the first region R1 (exemplified in FIGS. 8 and 9), d) masking the second region R2 with a masking material 7 (exemplified in FIG. 10), e) Providing a set of photoresist fins 8 on the second hardmask (exemplified in FIG. 10), f) Patterning the second hardmask and the first region R1 of the first hardmask by using the photoresist fins 8 as a mask, thereby forming a second set of hardmask fins 9 in the first region R1 of the first hardmask layer 4, g) Forming a first set of semiconductor fins 10 of a first height by etching the semiconductor substrate 3 while using the second set of hardmask fins 9 as a mask (the result of steps f and g is exemplified in FIG. 11), h) Removing the masking material 7 provided in step d (exemplified in FIG. 12), and i) Forming a second set of semiconductor fins 11 of a second height in the second region R2 and extending the height of the first set of semiconductor fins 10 to a third height in the first region R1, by etching the semiconductor substrate 3 using the first and second sets of hardmask fins as masks (exemplified in FIG. 13).

In embodiments, the semiconductor device 1 manufactured by embodiments of the method according to the first aspect may comprise a first set and a second set of field-effect transistors for operating at different voltages. In embodiments, these first and second sets of field-effect transistors may form part of a peripheral circuitry of a NAND memory device. In embodiments of the disclosed technology where the semiconductor device is a NAND memory device, it is an advantage of embodiments of the disclosed technology that a low threshold voltage mismatch can be achieved for (low voltage) FETs of the second set when compared to planar low voltage transistors. It is a further advantage of embodiments of the disclosed technology that area scaling can be achieved for (high voltage) FETs of the first set when compared to a planar high voltage transistor.

Figure 7:
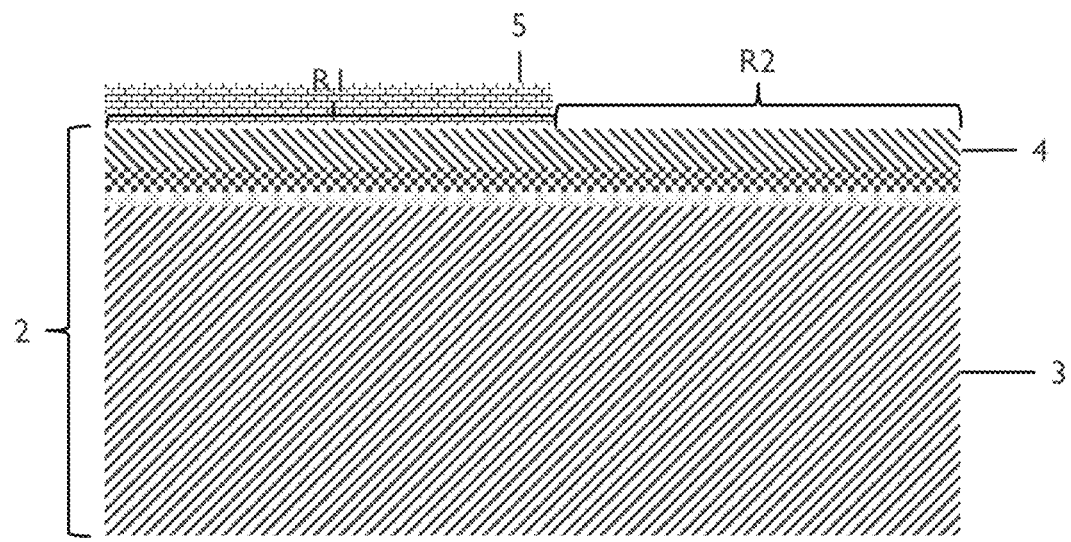
FIGS. 7-22 are schematic representations of vertical cross-sections through intermediate structures obtained at different steps of a method according to embodiments of the present disclosure.
Figure 8:
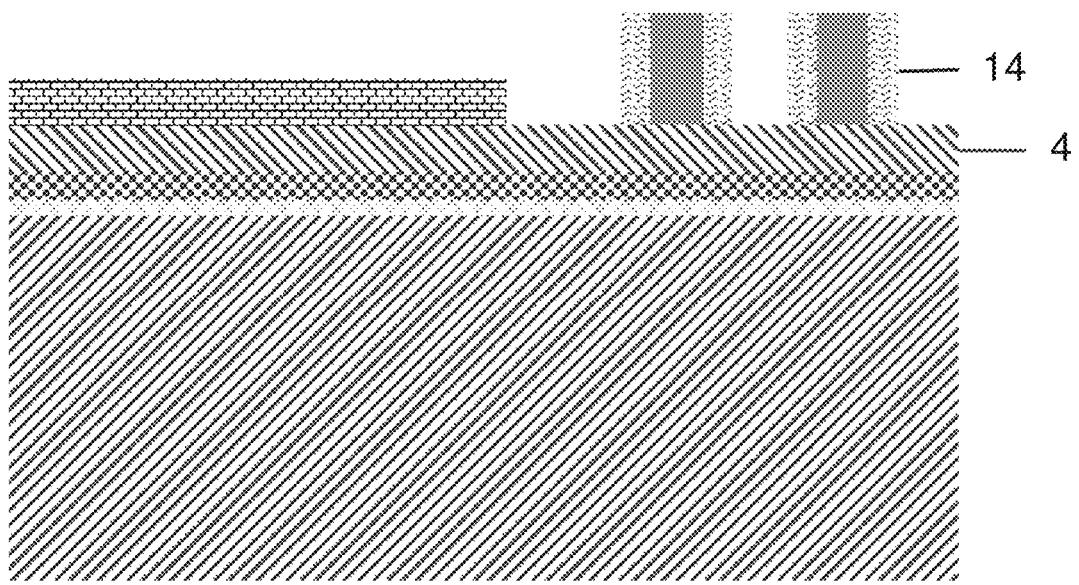
Figure 9:
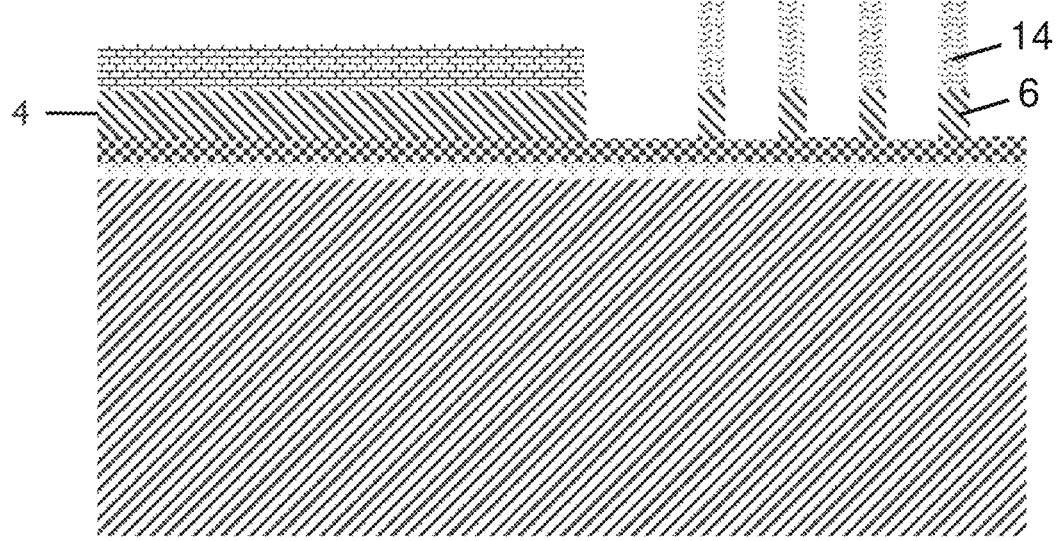

We now refer to FIG. 7.

The disclosed technology is not limited by the use of a particular type of semiconductor substrate 3. In embodiments, the semiconductor substrate 3 may be a Si substrate.

The first hardmask layer 4 is formed over the semiconductor substrate 3 but is not necessarily in physical contact therewith. In particular, one or more intermediate layers may be present between the first hardmask layer 4 and the semiconductor substrate 3. Typically, if the substrate is a silicon substrate, the one or more intermediate layers may be selected from silicon oxide and silicon nitride layers. For instance, a silicon oxide layer may be present on the Si substrate and a silicon nitride layer may be present on the silicon oxide layer. In embodiments, the thickness of the silicon oxide layer may be, e.g., 3 to 10 nm. In embodiments, the thickness of the silicon nitride layer may be, e.g., 10 to 40 nm. The first hardmask can be made of any material that can be etched selectively with respect to the second hardmask and with respect to a surface (e.g., a silicon nitride surface) on which the first hardmask is present. For instance, the first hard mask may be formed of a material selected from $SiO_2$ and SiCO.

In embodiments, the first hardmask layer 4 may have a thickness of from 30 to 100 nm.

In embodiments, step c may comprise the steps of:

c1. Forming a pattern of fins on the second region R2 of the first hardmask by self-aligned multiple patterning, e.g., self-aligned double patterning, and c2. Using this pattern as a mask to form the first set of hardmask fins 6 in the second region R2 of the first hardmask layer 4.

In such embodiments, the material of which the first hardmask is made is typically a material that can be etched selectively with respect to the pattern of fins.

In embodiments, the second hardmask layer 5 is provided over a first region R1 of the first hardmask layer 4. The second hardmask may but does not have to be in contact with the first hardmask. Typically, the second hardmask is in contact with the first hardmask.

In embodiments, the second hardmask layer 5 may have a thickness of, e.g., 10 to 50 nm.

Step b of providing the second hardmask layer 5 over the first region R1 of the first hardmask layer 4 and not over the second region R2 is typically achieved by first providing a hardmask layer over both regions, followed by patterning that layer by photolithography and removing a portion thereof. This typically involves the use of a photoresist. Hence, typically, step b results in the presence of a photoresist layer on the second hardmask layer 5.

The thickness and nature of the material of the second hardmask layer 5 can be chosen so that: the photoresist/second hardmask combination is not entirely consumed at the end of step c, and the second hardmask/first hardmask combination is not entirely consumed at the end of step g.

The second hardmask is typically made of a material that can be etched selectively with respect to the masking material 7 used in step d.

In some embodiments, it may be advantageous to have the second hardmask made of a material such that the first hardmask, the substrate, and the optional one or more intermediate layers can all be etched selectively with respect to the second hardmask. This is however, not necessary.

For instance, in the case of an assembly 2 made of a silicon substrate, a silicon oxide interlayer thereon, a silicon nitride interlayer on the silicon oxide, and a $SiO_2$ first hardmask on the silicon nitride, the second hardmask could be made of SiN, SiCN or SiC.

In embodiments, the first region R1 of the first hardmask layer 4 over which the second hard mask layer is provided is typically a region where a set of field-effect transistors (hereinafter referred to as the second set) for operating at a relatively high voltage will be formed.

The first set of hardmask fins 6 can be a set of parallel fins. In embodiments, their widths may be 5 nm to 30 nm or 7 nm to 25 nm. In embodiments, the pitch of the set of parallel fins may be 30 to 60 nm or 40 to 50 nm.

As mentioned above, step c of forming a first set of hardmask fins 6 in a second region R2 of the first hardmask layer 4 may comprise the steps of:

c1. Forming a pattern of fins 14 on the second region R2 of the first hardmask by self-aligned multiple patterning, e.g., self-aligned double patterning, and c2. Using this pattern as a mask to form the first set of hardmask fins 6 in the second region R2 of the first hardmask layer 4.

The pattern of fins 14 can be a set of parallel fins. In embodiments, their width may be 5 nm to 30 nm or 7 nm to 25 nm. In embodiments, the pitch of the set of parallel fins may be 30 to 60 nm or 40 to 50 nm.

The pattern of fins 14 is typically made of a material such that the first hardmask layer 4 can be etched selectively with respect to the pattern of fins.

For instance, in the case of an assembly 2 made of a silicon substrate, a silicon oxide interlayer thereon, a silicon nitride interlayer on the silicon oxide, and a $SiO_2$ first hardmask on the silicon nitride, the pattern of fins could be made of SiCO.

In embodiments, step c2 may comprise a step of dry etching the first hard mask layer through the mask formed by the pattern of fins. For instance, when the first hardmask layer 4 is made of $SiO_2$, step c2 could comprise exposing the first hardmask to a $CF_4$ plasma.

Figure 10:
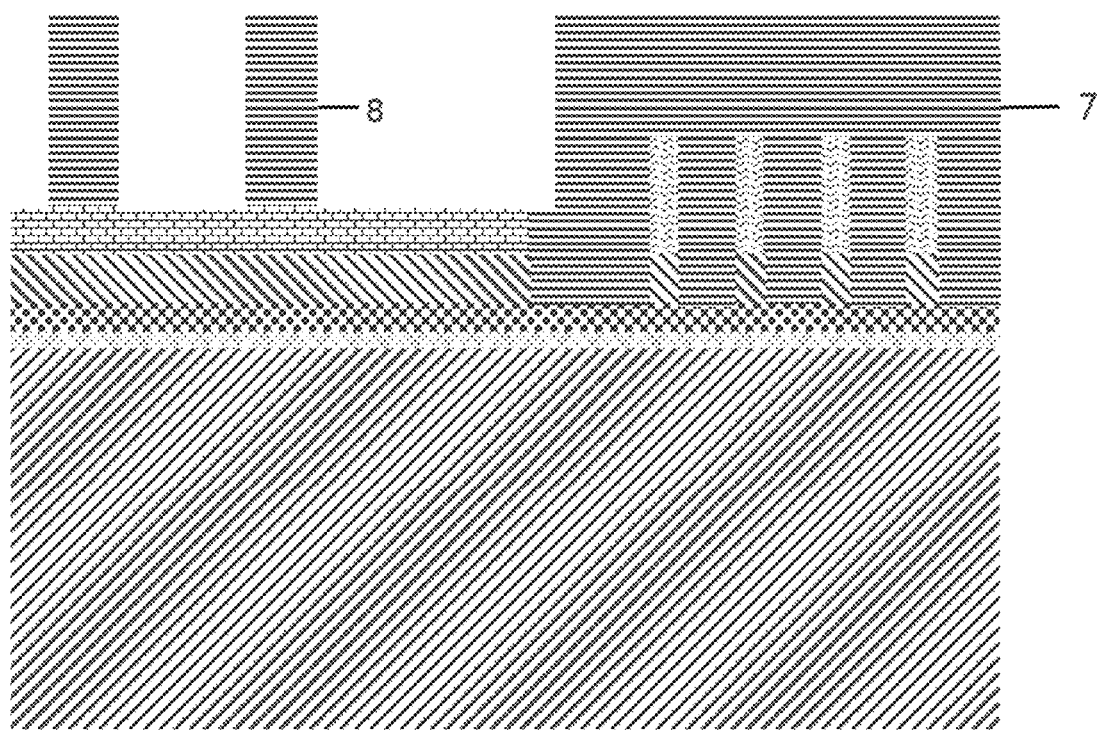

We now refer to FIG. 10.

In embodiments, the masking material 7 used to mask the second region R2, and the set of photoresist fins 8 provided in step e) may each independently be made of a material such that the second hardmask layer 5, the first hardmask layer 4, the optional one or more intermediate layers, and the semiconductor substrate 3 can be etched selectively with respect to the masking material 7. For instance, the masking material 7 and the set of photoresist fins 8 may both be made of a same photoresist.

For instance, steps d and e could be performed simultaneously by covering the second hard mask layer and the first set of hardmask fins 6 (and the pattern of fins thereon if steps c1 and c2 were performed) with a photoresist layer, followed by defining a mask for the second region R2 and a set of photoresist fins 8 on the second hardmask by photolithography.

In embodiments, the photoresist fins 8 may have a width of 25 to 100 nm or 40 to 60 nm.

In embodiments, the set of photoresist fins 8 may be composed of parallel fins spaced at a pitch of 70 to 150 nm or 90 to 130 nm.

Figure 11:
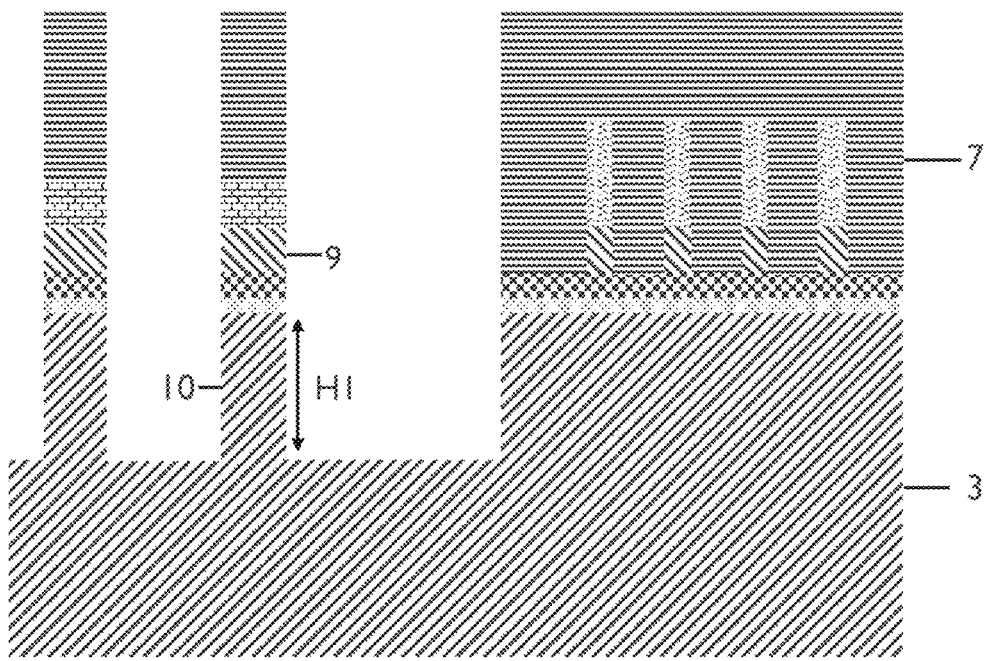

We now refer to FIG. 11. In step f, the second hardmask and the first region R1 of the first hardmask is patterned by using the photoresist fins 8 as a mask. In embodiments, this patterning can be performed by dry etching. For instance, in the case of an assembly made of a silicon substrate, a silicon oxide interlayer thereon, a silicon nitride interlayer on the silicon oxide, a $SiO_2$ first hardmask on the silicon nitride, and a SiCO second hardmask on the first hardmask, the dry etching could be a sequence of steps including a $CH_3F$ plasma etching step, a $CF_4$ plasma etching step, and/or a plasma etching step selected from $Cl_2$ and HBr plasma etching steps.

Step f forms a second set of hardmask fins 9 in the first region R1 of the first hardmask. In embodiments, the width of the hardmask fins of the second set may be 25 to 100 nm or 40 to 60 nm. In embodiments, the second set of hardmask fins 9 may be composed of parallel fins spaced at a pitch of 70 to 150 nm or 90 to 130 nm.

In step g, a first set of semiconductor fins 10 of a first height is formed by etching the semiconductor substrate 3 while using the second set of hardmask fins 9 (and typically the patterned second hardmask layer 5 present on the hardmask fins 9 and the photoresist fins 8 present on the patterned second hardmask layer 5) as a mask. The etching conditions can be similar or the same as the conditions used for the patterning step f. In embodiments, the first height may be 40 to 430 nm. In embodiments, the width ($FW_{HV}$, see FIG. 15) of the semiconductor fins of a first height may be 25 to 100 nm or 40 to 60 nm. In a particular implementation, each fin of that set has a width ($FW_{HV}$) within 10% of each other. In a particular implementation, they all have nominally the same width ($FW_{HV}$). In embodiments, the first set of semiconductor fins 10 of a first height may be composed of parallel fins spaced at a pitch ($FP_{HV}$, see FIG. 15) of 70 to 150 nm or 90 to 130 nm.

We now refer to FIG. 12. In step h, the masking material 7 provided in step d is removed. This can be performed by, e.g., stripping. Stripping can, for instance, be performed by an $O_2$ plasma or by a plasma of $N_2$ and $H_2$. In typical embodiments where the masking material 7 and the set of photoresist fins 8 are made of the same material, both the masking material 7 and the set of photoresist fins 8 can be removed in the same step.

We now refer to FIG. 13. In step i, a second set of semiconductor fins 11 of a second height is formed in the second region R2. In embodiments, the second height may be 60 to 120 nm. The second set of semiconductor fins 11 is typically a set of parallel fins. In embodiments, their width ($FW_{LV}$) may be from 5 nm to 30 nm or 7 nm to 25 nm. In embodiments, the pitch ($FP_{LV}$, see FIG. 15) of the second set of semiconductor fins 11 may be 30 to 60 nm or 40 to 50 nm.

In a particular implementation, each fin of the second set may have a width ($FW_{LV}$) within 10% of each other. In a particular implementation, they all have the same width ($FW_{LV}$).

In a particular implementation, each fin 11 of the second set may have a height (h2) within 10% of each other. In a particular implementation, they all have the same height (h2).

In step i, the height of the first set of semiconductor fins 10 is extended to a third height (h3). In embodiments, the third height (h3) may be 100 to 550 nm. In a particular implementation, each fin 10 of the first set may have a height (h3) within 10% of each other. In a particular implementation, they all have the same height (h3). The third height is larger than the second height.

In a particular implementation, each fin of the first set 10 may have a width ($FW_{HV}$) within 10% of each other. In a particular implementation, they all have the same width ($FW_{HV}$).

Step i operates by etching the semiconductor substrate 3 by using the first and second sets of hardmask fins 6, 9 as masks. For instance, when the hardmask fins 6, 9 are made of $SiO_2$ and when the semiconductor substrate 3 is a Si substrate 3, the etching can be a $Cl_2$ plasma etching.

Figure 14:
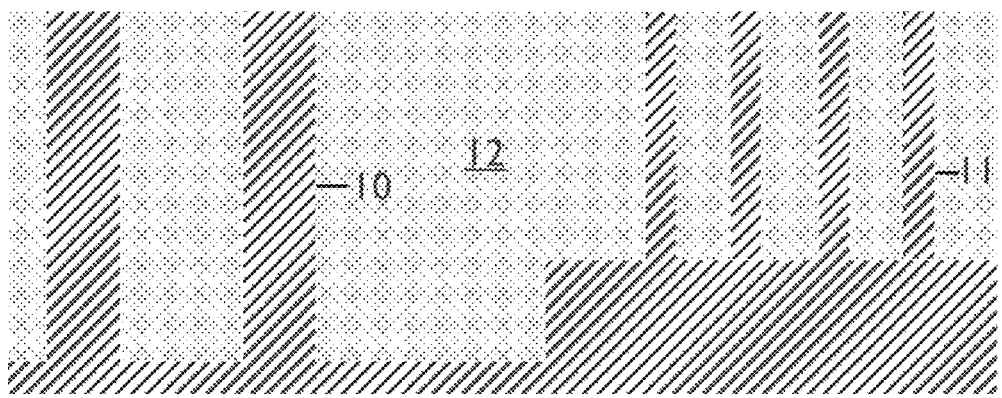
Figure 15:
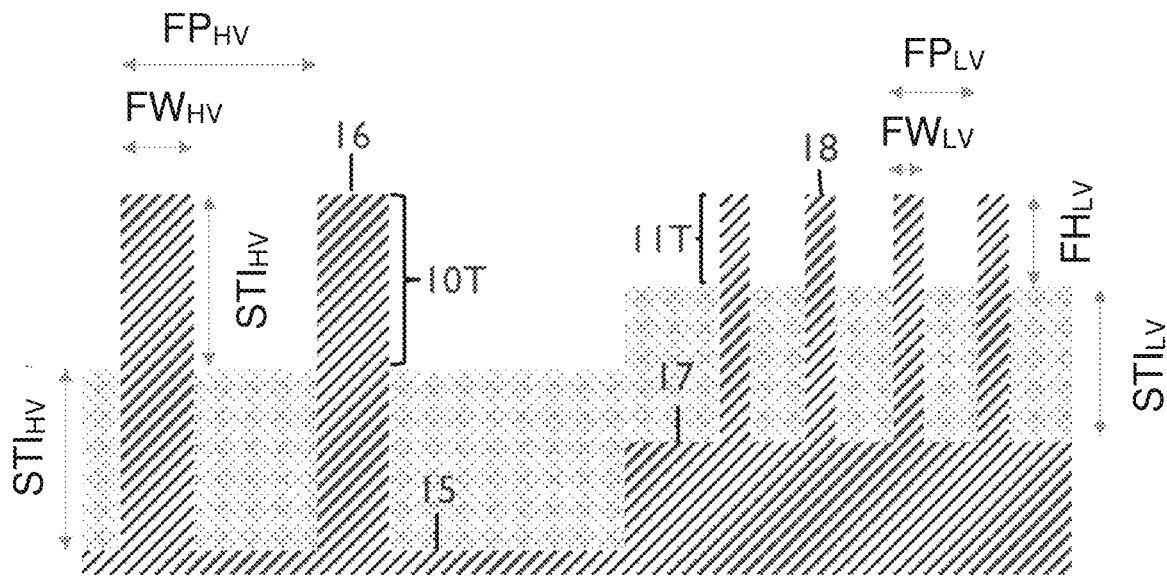

We now refer to FIGS. 14 and 15. Step j comprises providing an isolation material 12 between the semiconductor fins of the first set in such a way as to leave a top portion 10t of the semiconductor fins 10 of the first set uncovered. In embodiments, the isolation material 12 may be a dielectric material. The isolation material can be an oxide material. For instance, it may be a silicon oxide material. In embodiments, the isolation material 12 may have a thickness ($STI_{HV}$) in the first region of 50 to 400 nm. The top portion 10t which is left uncovered can have a height ($FH_{HV}$) of 50 to 150 nm, 80 to 110 nm, or 85 to 105 nm. Step k comprises providing an isolation material 12 between the fins of the second set in such a way as to leave a top portion 11t of the semiconductor fins 11 of the second set uncovered, wherein the uncovered top portion 11t of the fins 11 of the second set is smaller than the uncovered top portion 10t of the fins 10 of the first set. In embodiments, the isolation material 12 may be a dielectric material 12. For example, the isolation material 12 is an oxide material 12. For instance, it may be a silicon oxide material 12. The isolation material 12 provided in steps j and k can be the same. In embodiments, the isolation material 12 may have a thickness ($STI_L$v) in the second region of 40 to 70 nm. The top portion 11t which is left uncovered can have a height ($FH_L$v) of 20 to 50 nm or 30 to 40 nm.

In embodiments, forming the isolation material 12 in steps j and k may comprise depositing a layer of isolation material 12 covering the entire part of the device in construction present in the first and the second region R2, followed by chemical mechanical planarization and dry or wet etching until the top surface of the semiconductor fins of the first and the second set are exposed. In embodiments, where intermediate layers are present between the semiconductor substrate 3 and the first hardmask layer 4, the chemical mechanical planarization and dry or wet etching remove these interlayers.

Next, a top portion 10t of the semiconductor fins 10 of the first set and a top portion 11t of the semiconductor fins 11 of the second set are uncovered by recessing the isolation material 12 more in the first region R1 than in the second region R2 so that the uncovered top portion 11t of the fins 11 of the second set is smaller than the uncovered top portion 10t of the fins 10 of the first set.

This recessing can, for instance, be performed by masking the first region R1, recessing the isolation material 12 in the second region R2, unmasking the first region R1, and recessing both regions. Alternatively, a first region R1 can be masked, the isolation material 12 in the unmasked region can be recessed, the first region R1 can be unmasked, the second region R2 can be masked, then the isolation material 12 in the first region R1 can be recessed.

Figure 16:
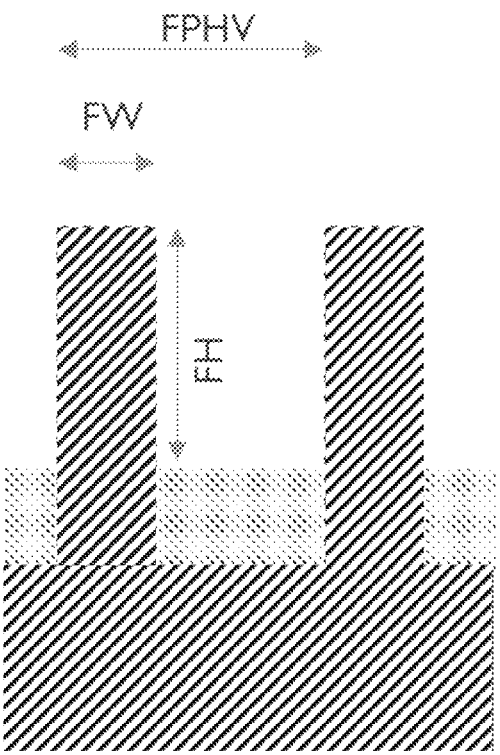
Figure 17:
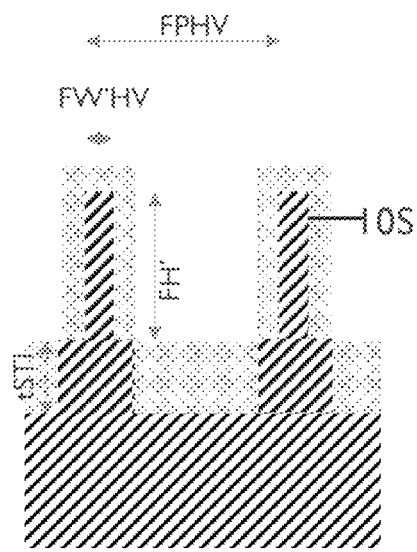

We now refer to FIGS. 16 and 17. In embodiments, the method may further comprise a step l of thinning each semiconductor fin of the first set.

As used herein, and unless provided otherwise, thinning a semiconductor fin relates to removing or transforming semiconductor material from at least the sidewalls of a semiconductor fin so that the thickness of semiconductor material present in the thinned fin 10s is less than the thickness of semiconductor material present in the fin before thinning.

In embodiments, step l of thinning each fin of the first set may comprise oxidizing sidewalls of said fins. Oxidizing sidewalls of a semiconductor fin transforms sidewalls of the semiconductor fin in an oxide, thereby thinning the semiconductor fin. Not removing the formed oxide (e.g., by dissolving it) may be advantageous because it permits to have a ready-formed gate dielectric around each fin.

In embodiments, thinning may be performed by oxidizing a periphery of each semiconductor fin of the first set, followed by dissolving the formed oxide. Removing the oxide may be advantageous as it permits replacing that oxide by another gate dielectric material (e.g., a high-k material).

For example, 15 to 25 nm of semiconductor material is may be removed or transformed from each side of each fin.

In embodiments, step l of thinning each fin of the first set may comprise reducing their width ($FW_{HV}$) by 30 to 50 nm or 35 to 45 nm.

Figure 18:
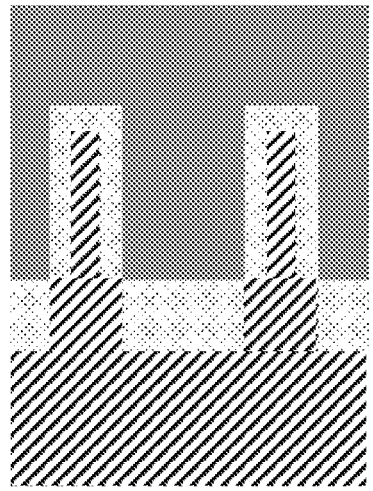
Figure 19:
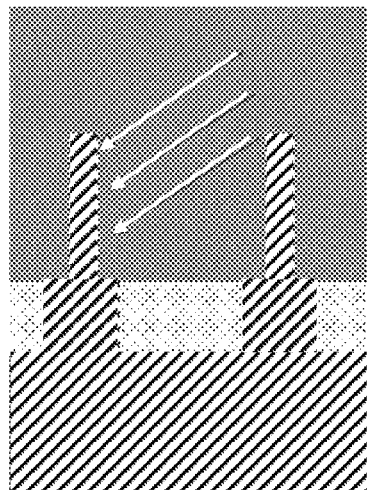

In embodiments, the width ($FW'_{HV}$) of each semiconductor fin 10s of the first set obtained after step l is 5 to 30 nm or 7 to 25 nm We now refer to FIG. 18. In embodiments, the semiconductor device 1 may comprise a first set and a second set of field-effect transistors for operating at different voltages, the method further comprising after step l the steps of:

m) Forming a first gate 13 on each semiconductor fin of the first set and forming a second gate 13 on each thinned semiconductor fin 10s of the first set, and n) Forming a source and a drain region in each thinned semiconductor fin 10s of the first set and in each semiconductor fin of the second set, thereby forming the first set and the second set of field-effect transistors respectively.

Step n is illustrated in FIGS. 19-22.

In embodiments, the first set of field-effect transistors may be configured for operating at a higher voltage than the second set of field-effect-transistor.

In embodiments, the first set of field-effect transistors may be configured for operating at 20V or more.

In embodiments, the second set of field-effect transistors may be configured for operating at from 0.5 to 10V.

In embodiments, step m of forming a first gate 13 or a second gate 13 may comprise providing a gate dielectric on the top side and the sidewalls of a portion of each fin, followed by embedding the gate dielectric-covered fins with a gate 13 metal. Embedding the gate dielectric-covered fins with a gate 13 metal may comprise providing a gate metal layer of the complete length of each fin of a set, followed by removing the gate metal layer from two spatially separated parts of each fin of the set. This removal can be performed by etching while using the insulating material as a stopping layer. The presence of a relatively thick insulating material layer in the first area is advantageous as it facilitates gate etch.

Step n of forming a source and a drain may comprise doping the semiconductor fins on either side of the gate 13. For instance, extension and/or halo implants can be made. In embodiments, step n may comprise performing a tilted implant (see FIG. 19). This can be especially advantageous for forming the source and the drain in the first set of semiconductor fins 10 because of their large height. Vertically implanting the first set of semiconductor fins may damage them. In embodiments, the tilt angle may be 30 to 60° or 40 to 50°, e.g. 45°. These embodiments are especially advantageous when each thinned fin 10s of the first set have a height (FH') within 5% of the first set pitch ($FP_{HV}$) minus the width ($FW'_{HV}$) of said fin.

Figure 20:
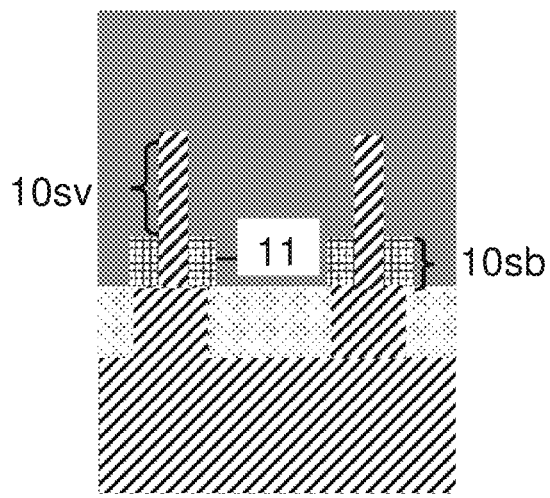
Figure 21:
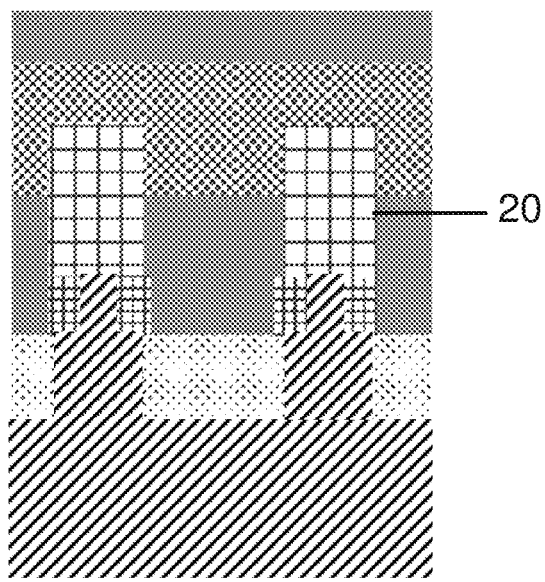

We now refer to FIG. 20. In embodiments, after ion implantation, forming a source and a drain region in each thinned semiconductor fin 10s of the first set and in each semiconductor fin 11 of the second set may further comprise forming a spacer layer 19 conformally on the source and the drain region of each fin, followed by vertically dry etching the spacer layer 19 in order to remove it from a upper portion 10su of the thinned fins 10s. In order for the semiconductor thinned fins 10s to better withstand the spacer etching, a hardmask can be used on top of the thinned fins 10s or the thinned fins 10s can be made taller than their target height, prior to etching, by an amount corresponding to the amount of semiconductor etched during the spacer etching. The result of the spacer etching is spacers 11 covering only a bottom portion 10sb of the sidewalls of each fin 10s.

Figure 22:
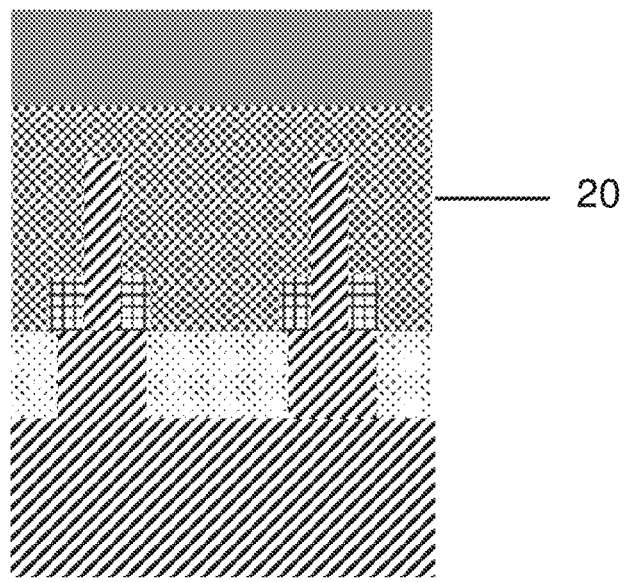

After the formation of the etched spacers 11, source and drain contacts 20 can be formed, e.g. by epitaxial growth (see FIG. 21) or by wrapping a contact material around the upper portion 10su of the thinned fins 10s in the source and drain regions (see FIG. 22).

In embodiments, when step m and step n are performed, the semiconductor device 1 may be a NAND memory device and the first and the second sets of field-effect transistors may form part of a peripheral circuitry of the NAND memory device.

Any semiconductor device 1 obtained in the first aspect may be as described in the second aspect.

In a second aspect, the disclosed technology relates to a semiconductor device 1 obtainable by any embodiment of the first aspect.

Expressed differently, in a second aspect, the disclosed technology relates to a semiconductor device 1 comprising a semiconductor substrate 3 comprising:

a. A first region R1 comprising a first platform and a first set of semiconductor fins 10 projecting perpendicularly therefrom, the semiconductor fins having coplanar top surfaces 16 and the first platform having a top surface 15, b. A second region R2 comprising a second platform and a second set of semiconductor fins 11 projecting perpendicularly therefrom, the semiconductor fins 11 having coplanar top surfaces 18 and the second platform having a top surface 17, wherein the first region R1 and the second region R2 are not overlapping, wherein the top surface 15 of the first platform is lower than the top surface 18 of the second platform, and wherein the coplanar top surfaces 16 of the first set of semiconductor fins 10 are coplanar with the coplanar top surfaces 18 of the second set of semiconductor fins 11.

Any feature of the second aspect, and in particular the semiconductor substrate 3, the first region R1, the first set of semiconductor fins 10, the second region R2, and the second set of semiconductor fins 11, may be as correspondingly described in the first aspect.

It is to be understood that although preferred embodiments, specific constructions and configurations, as well as materials, have been discussed herein for devices according to the present invention, various changes or modifications in form and detail may be made without departing from the scope of this invention. For example, any formulas given above are merely representative of procedures that may be used. Steps may be added or deleted to methods described within the scope of the present invention.

What is claimed is:

1. A method of manufacturing a semiconductor device, the method comprising:
   providing an assembly comprising a semiconductor substrate and a first hardmask layer thereover;
   next, providing a second hardmask layer over a first region of the first hardmask layer;
   next, forming a first set of hardmask fins in a second region of the first hardmask layer, the second region not overlapping with the first region;
   next, masking the second region with a masking material;
   next, providing a set of photoresist fins on the second hardmask layer;
   next, patterning the second hardmask layer and the first region of the first hardmask layer by using the photoresist fins as a mask, thereby forming a second set of hardmask fins in the first region of the first hardmask layer;
   next, forming a first set of semiconductor fins of a first height by etching the semiconductor substrate while using the second set of hardmask fins as a mask;
   next, removing the masking material;
   next, forming a second set of semiconductor fins of a second height in the second region and extending the height of the first set of semiconductor fins to a third height in the first region, by etching the semiconductor substrate by using the first and second sets of hardmask fins as masks.

2. The method according to claim 1, further comprising:
   providing an isolation material between the semiconductor fins of the first set in such a way as to leave a top portion of the semiconductor fins of the first set uncovered; and
   providing an isolation material between the semiconductor fins of the second set in such a way as to leave a top portion of the semiconductor fins of the second set uncovered, wherein the uncovered top portion of the fins of the second set is smaller than the uncovered top portion of the fins of the first set.

3. The method according to claim 2, further comprising thinning each semiconductor fin of the first set.

4. The method according to claim 3, wherein the semiconductor device comprises a first set and a second set of field-effect transistors configured for operating at different voltages, the method further comprising the steps of:
- forming a first gate on each thinned semiconductor fin of the first set and forming a second gate on each semiconductor fin of the second set, and
- forming a source region and a drain region in each thinned semiconductor fin of the first set and in each semiconductor fin of the second set, thereby forming the first set and the second set of field-effect transistors respectively.

5. The method according to claim 4, wherein the semiconductor device is a NAND memory device, and wherein the first and the second sets of field-effect transistors form part of a peripheral circuitry of the NAND memory device.

6. The method according to claim 4, wherein a width of the semiconductor fins of the second set is 5-30 nm.

7. The method according to claim 1, wherein the second set of semiconductor fins is composed of parallel fins spaced at a pitch of 30 to 60 nm.

8. The method according to claim 1, forming the first set of hardmask fins comprises:
- forming a pattern of fins on the second region of the first hardmask by self-aligned multiple patterning; and
- using the pattern of fins as a mask to form the first set of hardmask fins in the second region of the first hardmask layer.

9. The method according to claim 1, wherein the photoresist fins have a width of 25 to 100 nm.

10. The method according to claim 1, wherein the set of photoresist fins comprise parallel fins spaced at a pitch of 70 to 150 nm.

11. The method according to claim 3, wherein thinning each semiconductor fin of the first set comprises oxidizing sidewalls of the semiconductor fins.

12. The method according to claim 3, wherein thinning each semiconductor fin of the first set comprises reducing a width by 30 to 50 nm.

13. The method according to claim 1, wherein the second height is 60 to 120 nm.

14. The method according to claim 3, wherein a width of each semiconductor fin of the first set obtained after thinning each semiconductor fin is 5 to 30 nm.

* * * * *